(12) United States Patent
Hayashi et al.

(10) Patent No.: US 7,586,047 B2
(45) Date of Patent: *Sep. 8, 2009

(54) METHOD FOR MANUFACTURING PATTERNED POROUS MOLDED PRODUCT OR NONWOVEN FABRIC, AND ELECTRIC CIRCUIT COMPONENT

(75) Inventors: Fumihiro Hayashi, Osaka (JP); Yasuhito Masuda, Osaka (JP); Yasuhiro Okuda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 202 days.

This patent is subject to a terminal disclaimer.

(21) Appl. No.: 10/586,341

(22) PCT Filed: Jan. 13, 2005

(86) PCT No.: PCT/JP2005/000623

§ 371 (c)(1), (2), (4) Date: Jul. 14, 2006

(87) PCT Pub. No.: WO2005/068134

PCT Pub. Date: Jul. 28, 2005

(65) Prior Publication Data

US 2007/0160810 A1  Jul. 12, 2007

(30) Foreign Application Priority Data

Jan. 14, 2004  (JP)  ............................ 2004-007043

(51) Int. Cl.
*H05K 1/11* (2006.01)
*B31D 3/00* (2006.01)

(52) U.S. Cl. .................... 174/266; 174/258; 216/52; 216/53; 216/54; 216/56; 451/30; 451/38

(58) Field of Classification Search .............. 428/209; 174/255, 258, 266; 216/52–54, 56; 451/30, 451/38

See application file for complete search history.

(56) References Cited

U.S. PATENT DOCUMENTS 4,640,866 A * 2/1987 Suzuki ................... 428/422

(Continued)

FOREIGN PATENT DOCUMENTS

CN  1359544  7/2002

(Continued)

OTHER PUBLICATIONS

International Preliminary Report on Patentability and Written Opinion of the International Searching Authority issued in International Patent Application No. PCT/JP2005/000623 mailed on Aug. 31, 2006.

(Continued)

*Primary Examiner*—Cathy Lam
(74) *Attorney, Agent, or Firm*—McDermott Will & Emery LLP

(57) ABSTRACT

An object of the present invention is to provide a method for manufacturing a porous material in which complicated and fine through portions, recessed portions, and the like have been patterned. It is to provide a patterned porous molded product or nonwoven fabric, in which a plated layer has been selectively formed on the surfaces of the through portions and the recessed portions.

With the invention, a mask having through portions in a pattern is placed on at least one side of the porous molded product or the nonwoven fabric. A fluid or a fluid containing abrasive grains is sprayed from above the mask, thereby to form through portions or recessed portions, or both of them, to which the opening shape of each through portion of the mask has been transferred, in the porous molded product or the nonwoven fabric. The invention provides a porous molded product or a nonwoven fabric in which a plated layer has been selectively formed on the surfaces of the through portions or the recessed portions, or both of these, an electric circuit component, or the like.

12 Claims, 2 Drawing Sheets

U.S. PATENT DOCUMENTS

| | | | |
|---|---|---|---|
| 5,252,383 A | | 10/1993 | Fukutake et al. |
| 5,498,467 A | * | 3/1996 | Meola .................. 428/198 |
| 5,684,065 A | * | 11/1997 | Hiraoka et al. ............ 523/300 |
| 6,010,546 A | | 1/2000 | Hirano et al. |
| 6,245,696 B1 | * | 6/2001 | Haas et al. ................ 442/348 |

FOREIGN PATENT DOCUMENTS

| | | |
|---|---|---|
| DE | 198 24 225 A1 | 2/1999 |
| EP | 1 040 892 A1 | 10/2000 |
| JP | 57-073994 | 5/1982 |
| JP | 63186877 * | 8/1988 |
| JP | 4183873 * | 6/1992 |
| JP | 5-13951 A | 1/1993 |
| JP | 5-277943 | 10/1993 |
| JP | 10-86064 A | 4/1998 |
| JP | 10-284836 A | 10/1998 |
| JP | 11-87888 A | 3/1999 |
| JP | 11-102992 | 4/1999 |
| JP | 11-347942 | 12/1999 |
| JP | 2000-212755 * | 8/2000 |
| JP | 2000-212793 * | 8/2000 |
| JP | 2000-246696 A | 9/2000 |
| JP | 2001-38625 A | 2/2001 |
| JP | 2001-176329 | 6/2001 |
| JP | 2001-352171 | 12/2001 |
| JP | 2002-76574 A | 3/2002 |

OTHER PUBLICATIONS

European Search Report issued in corresponding European Patent Application No. EP 05 70 3853, dated Apr. 26, 2007.

Chinese Office Action, with English Translation, issued in Chinese Patent Application No. CN 2005800024594, dated May 16, 2008.

Japanese Office Action, with English translation, issued in Japanese Patent Application No. 2004-007043, mailed Apr. 28, 2009.

* cited by examiner

US 7,586,047 B2

METHOD FOR MANUFACTURING PATTERNED POROUS MOLDED PRODUCT OR NONWOVEN FABRIC, AND ELECTRIC CIRCUIT COMPONENT

RELATED APPLICATION

This application is a national phase of PCT/JP2005/000623 filed on Jan. 13, 2005, which claims priority from Japanese Application No. JP 2004-007043 filed on Jan. 14, 2004, the disclosures of which Applications are incorporated by reference herein. The benefit of the filing and priority dates of the International and Japanese Applications is respectfully requested.

TECHNICAL FIELD

The present invention relates to a method for manufacturing a porous molded product or a nonwoven fabric in which through portions such as through holes and through trenches, and recessed portions such as trenches have been patterned. Further, the invention relates to a method for manufacturing a porous molded product or a nonwoven fabric in which a plated layer has been selectively formed on the surfaces of the recessed portions or the through portions formed by patterning, or both of these. Still further, the invention relates to an electric circuit component made of a porous molded product or a nonwoven fabric having a plated layer formed in a pattern therein. The porous molded product or nonwoven fabric having a plated layer in a pattern in accordance with the invention can be preferably applied to the technical fields of a semiconductor device-mounting member, a member for electric reliability inspection, and the like.

BACKGROUND ART

A substrate for manufacturing an electronic component may be required to have through holes, through trenches, recessed portions, and the like formed therein. Whereas, an electric connection may be established, or an electric circuit may be formed by filling a conductive material in the through holes, the through trenches, and the recessed portions formed in the substrate, or forming a plated layer on the surfaces of the through holes, the through trenches, and the recessed portions.

For example, in a double-sided printed wiring board or a multilayer printed wiring board, connection of wiring patterns of the opposite sides or respective layers is carried out by silver through holes obtained by filling silver in the through holes formed in the substrate, or plated through holes obtained by plating the through holes. Further, as a semiconductor package, there is known an insertion type package to be mounted by inserting a lead introduced from the package to the substrate having through holes referred to as through holes.

As the hole processing methods for forming through holes in a printed wiring board, for example, mechanical processing methods such as blanking by a punching die and cutting processing by a drill are known. However, with such mechanical processing methods, fine processing may be difficult, or the methods are difficult to apply according to the material of the substrate.

Also in processing of trenches of a substrate for an electronic component, conventionally, the trenches have been formed by blanking with a die. However, the formation of flash upon blanking has been unfavorably inevitable. Under such circumstances, there has been proposed a method for subjecting a substrate for an electronic component having a metal foil on the surface to trench processing by water jet. More specifically, there is proposed a method in which the substrate is supported on a support provided with a water jet release hole to carry out trench processing by water jet, and thereby floating of the metal foil is prevented (see, e.g., Patent Document 1). However, with this method, the dimensions allowing trench processing depend upon the diameter of the jet of water jet. Therefore, fine processing is difficult, and in addition, the method is not suitable for processing trenches having a wide variety of patterns.

Conventionally, there has been proposed a method in which a glass thin plate or a sintered ceramic thin plate is sand blast processed to form through holes and recessed portions (see, e.g., Patent Document 2). Specifically, a resist pattern is formed on a glass thin plate or a sintered ceramic thin plate by a photo process. Thus, sand blast processing is carried out from above the resist pattern, thereby to process the positions and the shapes of the through holes and the recessed portions with high precision. In the resist pattern, an opening pattern corresponding to the through holes and the recessed portions is formed. Thus, the resist pattern serves as a mask during a sand blast processing. A conductive material is filled in the through holes and the recessed portions to form a wiring layer. A plurality of the wiring layers are stacked one on another to manufacture a multilayer wiring substrate.

Alternatively, the following method has been proposed. In a printed wiring board, openings each for passing there through a bonding wire to connect an electronic component to be mounted and a contact terminal are formed. At this step, the substrate covered with a resist for blast is subjected to sand blast processing, thereby to form the openings (see, e.g., Patent Document 3). As the substrate, a double-sided metal-laminated resin-coated substrate containing a glass fiber is used. In the resist for blast, an opening pattern corresponding to the openings is formed.

However, with a conventional sand blast processing, the formation of fine-pitch wiring, deep through holes, and deep trenches is difficult. The first reason for this is that the substrate to be subjected to a sand blast processing is a high hardness material such as a glass thin plate, a sintered ceramic thin plate, a resin substrate containing a glass fiber, or a resin laminated plate having a metal layer. The second reason is as follows: a mask material such as a resist for blast is required to be reduced in thickness as the pitch becomes finer; this however causes the mask itself to be incapable of standing a harsh sand blast processing or a long-time sand blast processing. Even in the case where a hard material such as a stainless steel thin plate is used as a mask material, when the object to be processed is a hard substrate, the mask pattern of fine through holes, through trenches, and the like, formed in the mask are chipped in the sand blast processing. Therefore, it is difficult to form deep through holes and trenches in the substrate with precision.

(Patent Document 1) JP-A-2000-246696
(Patent Document 2) JP-A-10-284836
(Patent Document 3) JP-A-11-102992

An object of the invention is to provide a method for manufacturing a porous material in which very complicated and fine through portions and recessed portions have been patterned, using a soft porous material in place of a conventional hard substrate material.

Particularly, another object of the invention is to provide a method for manufacturing a porous molded product or a nonwoven fabric in which fine through holes, trenches, and the like have been patterned with a processing method using a fluid such as a sand blast processing with a porous molded product or a nonwoven fabric targeted for processing under conditions causing less damages to a mask.

A still other object of the invention is to provide an electric circuit component made of a patterned porous molded product or nonwoven fabric in which a plated layer has been selectively formed on the surfaces of the through portions and the recessed portions.

The inventors conducted a close study in order to achieve the foregoing objects. As a result, they found the following fact. By a processing method in which a fluid is sprayed via a mask having through portions in a pattern, with a soft porous material, which has been conventionally considered very difficult or impossible to finely pattern by mechanical processing, targeted for processing, it is possible to obtain a porous material having through portions and recessed portions to which a pattern of fine through portions of the mask has been transferred. As the fluid, a fluid containing abrasive grains is preferably used.

The following fact was found. With this method, it is possible to carry out fine processing such as the formation of deep through holes and deep trenches without breaking the porous structure of the porous molded product. Further, a conductive metal is deposited on the surfaces of the through portions such as through holes and through trenches, and the recessed portions such as trenches formed by this method. As a result, it is possible to obtain a soft and elastic circuit substrate and an electric circuit component such as a member for the electric reliability inspection. This invention was completed based on these findings.

DISCLOSURE OF THE INVENTION

In accordance with the present invention, there is provided a method for manufacturing a patterned porous molded product or nonwoven fabric, characterized by placing a mask having through portions in a pattern on at least one side of a film-like or sheet-like porous molded product or nonwoven fabric formed from an organic polymer material, spraying a fluid or a fluid containing abrasive grains from above the mask, and forming through portions or recessed portions, or both of these, to which the opening shapes of the through portions of the mask have been transferred, in the porous molded product or the nonwoven fabric.

Further, in accordance with the invention, there is provided a method for manufacturing a patterned porous molded product or nonwoven fabric having a plated layer in a pattern, having the following steps 1 to 4;

(1) a step 1 of placing a mask having through portions in a pattern on at least one side of a film-like or sheet-like porous molded product or nonwoven fabric formed from an organic polymer material via a resin layer for resist, spraying a fluid or a fluid containing abrasive grains from above the mask, and forming through portions or recessed portions, or both of these, to which the opening shapes of the through portions of the mask have been transferred, in the resin layer for resist, and the porous molded product or the nonwoven fabric, (2) a step 2 of imparting a plating catalyst onto the entire surface of the porous molded product or the nonwoven fabric including the resin layer for resist, in which through portions or recessed portions, or both of these have been formed, (3) a step 3 of peeling the resin layer for resist, and (4) a step 4 of plating the porous molded product or the nonwoven fabric, and selectively forming a plated layer on the surfaces of the through portions or the recessed portions, or both of these, on which the plating catalyst has been deposited.

Still further, in accordance with the invention, there is provided an electric circuit component including a patterned porous molded product or nonwoven fabric having a plated layer in a pattern, characterized in that in a film-like or sheet-like porous molded product or nonwoven fabric formed from an organic polymer material, through portions or recessed portions in a pattern, or both of these are formed, and that the plated layer is selectively formed on the surfaces of the through portions or the recessed portions, or both of these.

ADVANTAGE OF INVENTION

In accordance with a method of the present invention, the fine and complicated pattern formation onto a soft porous material which has been very difficult with conventional mechanical processing is possible. With the method of the invention, it is possible to carry out fluid processing such as sand blasting onto a porous material under the conditions causing less damages to a mask. This allows the formation of fine trenches and through holes with simplicity. Namely, in accordance with the invention, deep trench processing and through hole processing are possible in a porous molded product or a nonwoven fabric which is too soft and very difficult to cut, and also, the porous structure will not be broken. The method of the invention achieves low cost and is suitable for mass production.

Further, in accordance with the invention, an electric circuit component such as a soft and low relative dielectric constant circuit substrate is provided. With the electric circuit component of the invention, the stress concentration due to load distortion or heat distortion is less likely to occur at an interface between a substrate and a circuit. With the electric circuit component of the invention, a porous material absorbs distortion, and hence overload is less likely to occur in wiring, and disconnection is less likely to occur.

Figure 1:
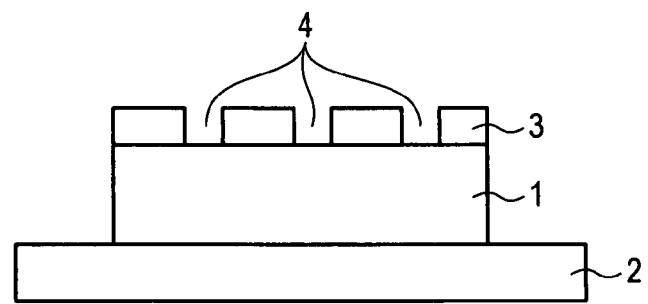
FIG. 1 is a cross sectional view showing one example of a patterning method by a fluid blasting method adopted in the present invention.

Incidentally, in reference numerals in the drawings, 1 denotes a porous molded product; 2, a stationary stage 3, a mask; 4, a through portion; 5, fluid blasting; 6, a through hole; 7, a buffer material; 51, a porous molded product; 52, a mask; 53, a mask; 54, a slit; 55, a slit; 56, a trench; 57, a trench; 58, a through hole; 71, a porous molded product; 72, a mask; 73, a resist film; 74, a through hole; 75, a trench; 76, a trench; and 77, a plated layer.

BEST MODE FOR CARRYING OUT THE INVENTION

In the present invention, patterning is performed on a film-like or sheet-like porous molded product or nonwoven fabric formed from an organic polymer material. The film denotes a thin sheet-like article with a film thickness of less than 250 µm. The sheet denotes the one with a film thickness of 250 µm or more, and includes a plate-like article. The film or sheet may be in the form of a monolayer or a multilayer.

As the organic polymer materials, various materials may be used according to the intended purpose. Specific examples there of may include elastomers such as natural rubber, polyurethane, and silicone rubber; and resins such as epoxy resin, acrylic resin, polyimide, polytetrafluoroethylene, and polyethylene. To these elastomers or resins, if required, a filler such as carbon or silica; a colorant, a lubricant, and other various additives may be mixed.

When the porous molded product or the nonwoven fabric is used as a substrate material, it is desirably formed of an electrically insulating organic polymer material. Further, when the porous material or the nonwoven fabric is adapted to the application in which a semiconductor device or the like is used through a high frequency signal, it is preferably the one formed of a low dielectric constant synthetic resin so as not to cause signal delay.

Out of the porous molded product and the nonwoven fabric, the porous molded product is preferred in that fine processing can be carried out with precision by a sand blast processing or the like, and in that the fabrication of an electric circuit substrate is easy. Thus, below, a description will be given centering on the porous molded product. However, patterning in accordance with the method of the invention can also be carried out in the same manner on a nonwoven fabric.

Examples of a preferred synthetic resin forming a porous molded product may include fluororesins such as polytetrafluoroethylene (PTFE), tetrafluoroethylene/hexafluoropropylene copolymer (FEP), tetrafluoroethylene/perfluoroalkyl vinyl ether copolymer (PFA), polyvinylidene fluoride (PVDF), polyvinylidene fluoride copolymer, and ethylene/tetrafluoroethylene copolymer (ETFE resin); engineering plastics such as polyimide (PI), polyamideimide (PAI), polyamide (PA), modified polyphenylene ether (mPPE), polyphenylene sulfide (PPS), polyether ether ketone (PEEK), polysulfone (PSU), polyether sulfone (PES), and liquid crystal polymer (LCP).

When the porous molded product is used as an electric circuit substrate, an porous molded product of an epoxy resin, polyimide, or fluororesin is preferably used. Particularly, a porous molded product made of a fluororesin such as PTFE is preferred because of the high insulation property, the low relative dielectric constant, the low moisture absorbency, and the high heat resistance.

Namely, out of the foregoing resins, a fluororesin is preferred, and PTFE is particularly preferred from the viewpoints of the heat resistance, the chemical resistance, the processability, the mechanical characteristics, the dielectric characteristics (low dielectric constant), and the like. With the manufacturing method of the invention, a cleaning treatment by a solvent may be carried out. For this reason, the synthetic resin forming the porous molded product is preferably insoluble or slightly soluble in a solvent. A fluororesin is preferred, and PTFE is in particularly preferred also in terms of such a resistance to a solvent. As the methods for fabricating a film-like or sheet-like porous molded product, mention may be made of a hole making method, a phase separation method, a solvent extraction method, a drawing method, a laser irradiation method, and the like.

Out of the porous molded products, a porous polytetrafluoroethylene (which is hereinafter abbreviated as a "porous drawn PTFE") film or sheet obtained by a drawing method is excellent in heat resistance, processability, mechanical characteristics, dielectric characteristics, and the like, and has a uniform pore size distribution, and hence it is an excellent material as a substrate.

The porous drawn PTFE film or sheet for use in the invention can be manufactured by, for example, the method described in JP-B-42-13560. First, to an unsintered powder of PTFE, a liquid lubricant is mixed, and the mixture is extruded into a tube form or a plate form by ram extrusion. When a film or sheet with a small thickness is desired, rolling to a plate-like body is carried out by a reduction roll. After the extrusion rolling step, if required, the liquid lubricant is removed from the extrusion molded product or rolling molded product. The extrusion molded product or rolling molded product thus obtained is at least uniaxially drawn, so that an unsintered porous PTFE can be obtained in the form of a film. The unsintered porous PTFE film is heated to a temperature of not less than 327° C. which is the melting point of PTFE while being fixed so as not to undergo shrinkage, so that the drawn structure is sintered, and fixed. This results in a porous drawn PTFE film or sheet with high strength. The porous drawn PTFE tube can be changed to a flat film or sheet by being cut along the direction of the length.

The porous drawn PTFE film or sheet each has a fine fibrous texture including a very fine fibril formed by PTFE and nodes mutually connected by the fibril. In the porous drawn PTFE film or sheet, the fine fibrous texture forms a porous structure. Therefore, in the porous drawn PTFE film or sheet, the resin portion of the porous structure includes a fibril and a node, and the voids of the porous structure is the space formed by the fibril and the nodes. The porous drawn PTFE film or sheet is excellent in elasticity along the direction of the film thickness, and also excellent in elastic recovery characteristic. A plurality of the porous drawn PTFE films or sheets can be stacked one on another, and thermally crimped, thereby to be fused into an integral multilayer film or sheet The porosity of the porous molded product is preferably 20% or more, and more preferably 40% or more. This is desirable because the processability by sand blast is enhanced. Whereas, when the porous molded product is used as a circuit substrate, the porosity is preferably in the range of 20 to 90%, and more preferably 40 to 80%. This is desirable for satisfying both of the reduction of the relative dielectric constant and the deformation absorbency and the shape holding ability.

The pore size (average pore size) of the porous molded product is preferably 10 µm or less, and more preferably 5 µm or less. When the pore size of the porous molded product is 1 µm or less, preferably, super fine processing is possible, and in addition, it is possible to obtain high fixability of a plated film by the anchoring effect. The pore size of the porous molded product is preferably equal to or larger than the average grain diameter of the abrasive grains included in the fluid for use in processing, and more preferably less than the average grain diameter of the abrasive grains.

The thickness of the porous molded product can be appropriately selected according to the intended purpose, the intended site, or the like. However, it is generally 3 mm or less, and preferably 2 mm or less. The lower limit thereof is generally 5 µm, and preferably about 10 µm. The thickness of the porous molded product is set to be generally 1 to 2 mm (1000 to 2000 µm) when the product is used in the manner in which a probe card is used for semiconductor inspection, generally 1 mm (1000 µm) or less, and preferably 500 µm or less when the product is used as a flexible substrate, and 100 µm or less when the product is used as a multilayer high density wiring substrate.

With the method of the invention, a mask having through portions in a pattern is placed on at least one side of the porous molded product or the nonwoven fabric. A fluid or a fluid containing abrasive grains is sprayed from above the mask, thereby to form through portions or recessed portions, or both of them, to which the opening shapes of through portions of the mask have been transferred, in the porous molded product or the nonwoven fabric.

As the mask for forming a desirable pattern, for example, the one obtained by patterning a film or a plate made of a metal by mechanical processing such as press blanking or cutting, or the one obtained by patterning through a laser or the like can be used. Alternatively, it is also possible to use a mask with a fine pattern fabricated by photolithography, and electroless plating and electrolytic plating, or a combination of these. In this case, more fine and complicated processing becomes possible.

The shapes of the through portions formed in a mask are, for example, the pin hole (through hole), slit (through trench), and other given pattern shapes. There may be one through portion or a plurality of through portions. Specific examples of the mask may include a film or a thin plate made of a stainless steel with a thickness of generally 0.01 to 1 mm, and preferably 0.02 to 0.5 mm.

As the fluid for use in patterning, mention may be made of a gas such as compressed air, or a liquid such as water. The fluid is preferably allowed to contain abrasive grains for enhancing the processability. In the invention it is particularly preferable to adopt a sand blast processing method using a compressed air containing abrasive grains.

As the abrasive grains to be used, generally, the one with a higher hardness than that of the material forming a porous molded product, a nonwoven fabric, or the like. Examples of the abrasive grains may include grains of silica, alumina, and the like. The abrasive grains are preferably the ones which can be extracted/washed and removed by a solvent after processing. For example, water soluble inorganic salts such as sodium chloride are preferably used in terms of the ease of handling. Use of abrasive grains with an average grain diameter as small as possible enables fine and high precision processing. The average grain diameter of abrasive grains is generally 0.1 to 10 µm, and preferably about 1 to 8 µm. The average grain diameter of abrasive grains is preferably equal to, or larger than the average pore size of the porous molded product, and more preferably larger than the average pore size. A sand blast processing can be carried out in accordance with an ordinary method using a compressed air containing abrasive grains.

The processing method adopted in the invention will be described by reference to the accompanying drawings. As shown in FIG. 1, a porous molded product (or a nonwoven fabric) 1 is fixed on a stationary stage 2, and a mask 3 having through portions 4 in a desirable pattern is placed thereon. The mask is preferably fixed on the porous molded product so as to prevent the mask from moving during processing. As the method for fixing the porous molded product 1 onto the stationary stage 2, and the method for fixing the mask 3 onto the porous molded product 1, mention may be made of a fixing method using a plastic tape or an adhesive tape, a fixing method using an adhesive, and the like. However, the methods are not limited to these methods. When the mask 3 is fixed on the porous molded product 1 by an adhesive, preferably, the thickness of the adhesive layer is made very thin, or the adhesive is applied there to except for the through portions 4 of the mask 3, so as not to hinder the hole making processing.

Figure 2:
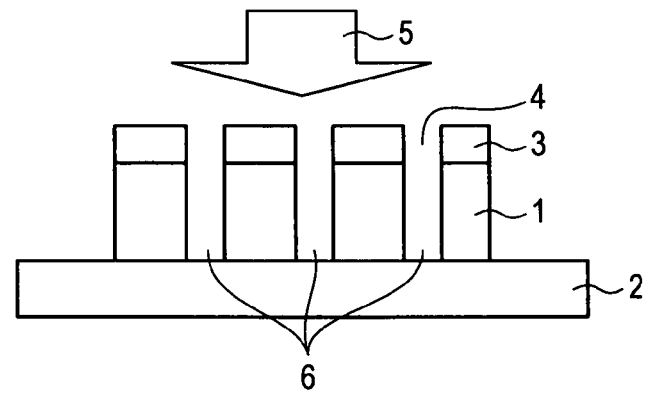
FIG. 2 is a cross sectional view showing the one example of a patterning method by a fluid blasting method adopted in the present invention.

Then, as shown in FIG. 2, a fluid (gas or liquid) 5 is sprayed from above the mask 3. As the fluid 5, a compressed air containing abrasive grains is preferably used. By spraying of the fluid 5, through portions or recessed portions, or both of these, to which the opening shapes of the through portions 4 of the mask have been transferred, are formed in the porous molded product 1. The recessed portions are non-through holes or trenches, or the like, but a part of them may be through ones. FIG. 2 shows that in the porous molded product 1, through holes (or through trenches) 6, to which the opening shapes of the through portions 4 of the mask had been transferred, have been formed.

Figure 3:
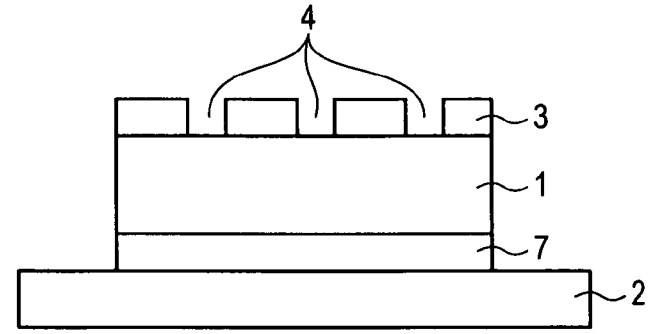
FIG. 3 is a cross sectional view showing another example of a patterning method by a fluid blasting method adopted in the present invention.
Figure 4:
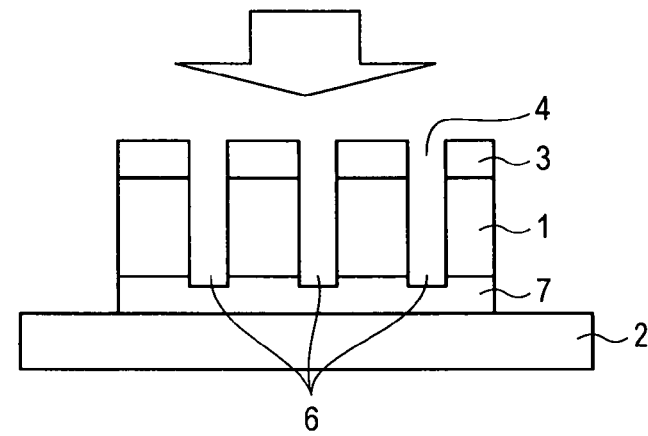
FIG. 4 is a cross sectional view showing the another example of a patterning method by a fluid blasting method adopted in the present invention.

FIGS. 3 and 4 show the embodiment in which patterning is carried out in the same manner as in FIGS. 1 and 2, except that a buffer material 7 having flexibility such as a nonwoven fabric (including a felt) or a porous product is placed on the stationary stage 2, and that the porous molded product (or the nonwoven fabric) 1 is fixed thereon. By placing such a buffer material 7, it is possible to form more minute and precise through portions or recessed portions in the porous molded product 1.

After patterning, the porous molded product 1 (or the nonwoven fabric) is peeled from the stationary stage 2, the mask 3, the buffer material 7, and the like. In the peeling step, if required, washing with an organic solvent or water is carried out, so that the used adhesive is dissolved or removed, and abrasive grains deposited on the through portions and the recessed portions are removed.

Figure 5:
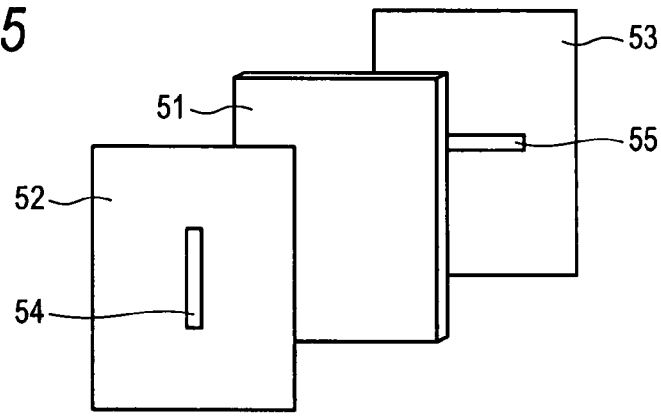
FIG. 5 is a cross sectional view showing a still other example of a patterning method by a fluid blasting method adopted in the present invention.
Figure 6:
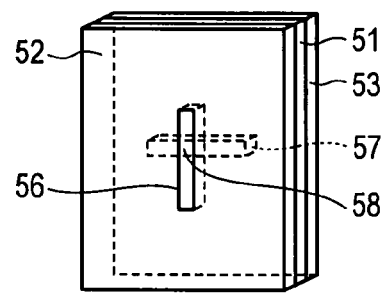
FIG. 6 is a cross sectional view showing the still other example of a patterning method by a fluid blasting method adopted in the present invention.

FIGS. 5 and 6 show the embodiment in which masks 52 and 53 are placed on the opposite sides of the porous molded product 51 (or the nonwoven fabric) to carry out patterning. When the porous molded product 51 is a monolayer or multilayer sheet with a large thickness, patterning can be carried out from the opposite sides thereof. Slits 54 and 55 are formed in the masks 52 and 53, respectively. After the masks 52 and 53 have been fixed on the opposite sides of the porous molded product 51, one side (for example, the mask 53 side) is fixed on the stationary stage, so that processing by sand blast or the like is carried out from above the mask 52. In this case, trenches are formed to a depth about half the film thickness of the porous molded product 51. Then, the processed side is fixed on the stationary stage, so that processing of sand blast or the like is carried out from above the mask 53. Also in this case, trenches are formed to a depth about half the film thickness of the porous molded product 51. As a result, trenches 56 and 57 are formed on the opposite sides of the porous molded product 51, so that through holes (through holes) 58 are formed in the sites of intersection of these trenches.

The processing methods shown in FIGS. 1 to 6 show the specific examples of the processing method of the invention, and the methods of the invention is not limited thereto. By the use of a mask provided with through portions in a given shape, it is possible to form a given pattern in a porous molded product or a nonwoven fabric.

In accordance with the method of the invention, it is possible to form through portions and recessed portions without breaking the porous structure of the porous molded product, and it is also possible to hold the porous structure of the walls (such as sidewalls) of the through portions and the recessed portions. By utilizing the porous structure of the through portions and the recessed portions of the porous molded product, it is possible to form a strongly fixed plated layer (plated film).

In order to plate the through portions and the recessed portions formed in the porous molded product (or the nonwoven fabric), and form an electric circuit, a plated layer is required to be formed only on the through portions and the recessed portions. For that purpose, an anti-plating resist film is required to be formed on the porous molded product (porous substrate) before carrying out fluid blasting such as sand blasting. The resist film can be removed in the form of the through portions of the mask by fluid blasting such as sand blasting. It is required to be formed of a material not interfering with the formation of the through portions and the recessed portions of the porous molded product placed thereunder.

Desirably, the anti-plating resist film can be dissolved and removed by the use of a solvent or the like, after carrying out electroless plating or electrolytic plating, or during the plating process, or can be peeled and removed mechanically. As the anti-plating resist film, for example, a commercially available adhesive tape can be used. Alternatively, as the resist film, there can be used an acrylic resin film formed by dissolving an acrylic resin in an organic solvent such as acetone, and coating the resulting solution on a porous substrate, and then drying and removing the solvent.

Further, as the anti-plating resist film, a film-like or sheet-like porous molded product can be used. Specifically, three or more porous films are stacked one on another to fabricate a multilayer porous molded product. The multilayer porous molded product is used, and subjected to patterning. Then, a plating catalyst is imparted thereto, then, the porous films are peeled and removed from the opposite sides. As a result, it is possible to obtain a porous molded product in which the plating catalyst has been deposited only on the through portions and the recessed portions. By carrying out electroless plating, and further electrolytic plating by using the plating catalyst, it is possible to selectively form a plated layer with a desirable thickness.

In the invention, the foregoing acrylic resin film or the porous molded product (porous film) is preferably used as the resist resin layer. Namely, for fabricating an electric circuit component, there is preferably adopted a method for manufacturing a patterned porous molded product or nonwoven fabric having a plated layer in a pattern, by the following steps 1 to 4;

(1) a step 1 of placing a mask having through portions in a pattern on at least one side of a film-like or sheet-like porous molded product or nonwoven fabric formed from an organic polymer material via a resin layer for resist, spraying a fluid or a fluid containing abrasive grains from above the mask, and forming through portions or recessed portions, or both of these, to which the opening shapes of the through portions of the mask have been transferred, in the resin layer for resist, and the porous molded product or the nonwoven fabric, (2) a step 2 of imparting a plating catalyst onto the entire surface of the porous molded product or the nonwoven fabric including the resin layer for resist, in which through portions or recessed portions, or both of these have been formed, (3) a step 3 of peeling the resin layer for resist, and (4) a step 4 of plating the porous molded product or the nonwoven fabric, and selectively forming a plated layer on the surfaces of the through portions or the recessed portions on which the plating catalyst has been deposited, or both of these.

Figure 7:
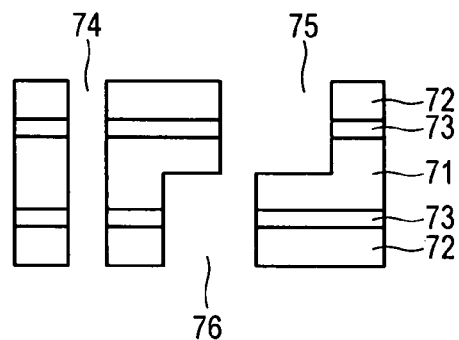
FIG. 7 is a cross sectional view showing one example of a method for forming a plated layer on through portions and recessed portions of a porous molded product.
Figure 8:
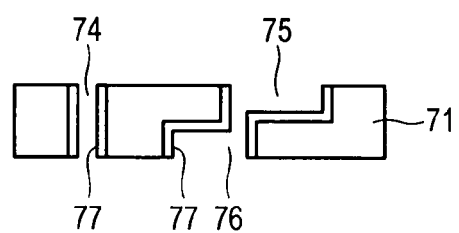
FIG. 8 is a cross sectional view showing the one example of a method for forming a plated layer on the through portions and the recessed portions of the porous molded product.

FIGS. 7 and 8 show one example of the plating step. On the opposite sides of a porous molded product (or a nonwoven fabric) 71, anti-plating resist films (resist resins) 73 are placed. Further, masks 72 are placed thereon. Thus, by fluid blasting such as sand blasting, through holes 74 and trenches 75 and 76 (a part of which are through ones) are formed. After patterning, the masks 72 are peeled off. Then, after imparting a plating catalyst, the resist films 73 are peeled off and removed. By carrying out electroless plating by using the plating catalyst deposited on the walls of the through holes 74, and the trenches 75 and 76, it is possible to selectively form plated layers 77. On the electroless plated layer, other conductive metal particles of an electrolytic plated layer or the like may be precipitated.

For forming a plated layer, by the use of a porous molded product which has been patterned, and has a resist film, first, a plating catalyst (i.e., a catalyst for accelerating the reduction reaction of metal ions) is deposited on the entire surface including the walls of the through portions and the recessed portions. As the method for depositing a conductive metal on the wall of the through holes, through trenches, and the recessed portions of the porous molded product, an electroless plating method is preferred. With the electroless plating method, generally, a catalyst for promoting the chemical reduction reaction is previously imparted onto the sites on which plating is demanded to be precipitated. In order to carry out electroless plating only on the walls of the through portions and the recessed portions of the porous molded product, a plating catalyst is required to be deposited only on the sites. When plating is deposited on the sites other than the walls of the through holes and the recessed portions, each conductive portion formed by the plated layer deposited on the walls of the through holes, through trenches, the recessed portions, and the like is short-circuited. Thus, in the step of imparting a plating catalyst, the foregoing resist film is used.

For imparting the plating catalyst, a porous molded product, which has a resist film, and has been patterned, is subjected to conditioning, if desired. Then, for example, it is dipped in a palladium-tin colloid catalyst imparting solution with sufficient stirring. After dipping in the catalyst imparting solution, the resist film is removed. As a result, it is possible to obtain a porous molded product in which plating catalyst grains have been deposited only on the walls of the through portions and the recessed portions of the porous molded product.

By using the plating catalyst deposited and remaining on the walls of the through portions and the recessed portions of the porous molded product, a conductive metal is deposited on the walls. As the method for depositing a conductive metal, an electroless plating method is preferably adopted. By dipping the porous molded product in an electroless plating solution, it is possible to precipitate a conductive metal only on the walls of the through holes and the through trenches, and the recessed portions. As a result, a conductive part (electric circuit) is formed. As the conductive metals, mention may be made of copper, nickel, silver, gold, nickel alloy, and the like. Especially when high conductivity is necessary, copper is preferably used.

When a porous drawn PTFE film or sheet is used, plating grains (crystal grains) first precipitate in such a manner as to get caught in fibrils exposed on the walls of the through portions and the recessed portions. Therefore, by controlling the plating time, it is possible to control the deposition state of the conductive metal. By controlling the electroless plating time, it becomes possible to achieve a proper plating amount, and also to impart the conductivity simultaneously with the elasticity. The thickness of the resin portion of the porous structure (e.g., the thickness of the fibril) is preferably 50 µm or less. The grain diameter of the conductive metal is preferably about 0.01 to 5 µm. The amount of the conductive metal to be deposited is preferably set at about 0.01 to 4.0 g/ml in order to keep the porous structure and the elasticity.

To the conductive part (electric circuit) fabricated as described above, preferably, an antioxidant is used, or a noble metal or an alloy of a noble metal is coated in order to enhance the antioxidation and electric contact properties. As the noble metal, palladium, rhodium, or gold is preferred in terms of the small electric resistance. The thickness of the coating layer of a noble metal or the like is preferably 0.005 to 0.5 µm, and more preferably 0.01 to 0.1 µm.

EXAMPLES

Below, the invention will be described more specifically by way of Examples and Comparative Examples.

Example 1

A porous drawn PTFE film (trade name "HP010-60", manufactured by SUMITOMO ELECTRIC FINE POLYMER, INC.) with a pore size of 0.1 µm, a porosity (ASTM D-792) of about 50%, and a film thickness of 60 µm was smoothed and placed on a glass plate, and fixed at the edges by a tape made of plastic so as not to move. On the porous drawn PTFE film, an instant adhesive (trade name "Aron Alpha", manufactured by TOAGOSEI Co., Ltd.) was thinly applied. Then, on the instant adhesive layer, a mask made of a stainless steel with a thickness of 0.05 mm, having a slit with a width of 100 µm and a length of 5 mm opened therein, was placed. The film-was allowed to stand still for a whole day and night, so that the instant adhesive was sufficiently dried, thereby to fix the mask made of a stainless steel on the porous drawn PTFE film.

From above the mask made of a stainless steel, a sand blast processing by a compressed air was carried out by the use of alumina abrasive grains with an average grain diameter of about 5 µm. By the inspection with a transmitted light, it was verified that slit-like through trenches were formed in the porous drawn PTFE film. Then, the porous drawn PTFE film and the mask made of a stainless steel were removed from the glass plate.

This was dipped in acetone for several hours to dissolve the adhesive, and the mask made of a stainless steel and the porous drawn PTFE film were separated from each other. Then, the porous PTFE film was dried. In the porous PTFE film, slit-like through trenches were formed. From the visual observation in this state, it could be confirmed that the periphery of the through trenches was colored, and that abrasive grains were deposited thereon.

This was dipped in ethanol, and subjected to ultrasonic cleaning for 5 minutes, and dried. As a result, it became impossible to visually observe the deposition of abrasive grains. As a result of SEM observation of the cross section and the sidewall of the slit-processed part, it was not possible to confirm the presence of abrasive grains. Further, the porous structure of the trenchesidewall was held without being broken.

Example 2

A porous drawn PTFE film (trade name "WP500-100", manufactured by SUMITOMO ELECTRIC FINE POLYMER, INC.) with a pore size of 5 µm, a porosity of about 80%, and a film thickness of 100 µm was smoothed and placed on a glass plate, and fixed by a tape so as not to move. On the porous drawn PTFE film, an instant adhesive (trade name "Aron Alpha", manufactured by TOAGOSEI Co., Ltd.) was thinly applied. Then, on the adhesive layer, a mask made of a stainless steel with a thickness of 0.05 mm, having a slit with a width of 100 µm and a length of 5 mm opened therein, was placed. The film was allowed to stand still for a whole day and night, so that the instant adhesive was sufficiently dried, thereby to fix the mask made of a stainless steel on the porous drawn PTFE film.

From above the mask made of a stainless steel, a sand blast processing by a compressed air was carried out by the use of alumina abrasive grains with an average grain diameter of about 5 µm. By the inspection with a transmitted light, it was verified that slit-like through trenches were formed in the porous drawn PTFE film. Then, the porous drawn PTFE film and the mask made of a stainless steel were removed from the glass plate.

This was dipped in acetone for several hours to dissolve the adhesive, and the mask made of a stainless steel and the porous drawn PTFE film were separated from each other. Then, the porous drawn PTFE film was dried. In the porous drawn PTFE film, slit-like through trenches were formed. From the visual observation in this state, it could be confirmed that the periphery of the through trenches was colored, and that abrasive grains were deposited thereon.

This was dipped in ethanol, and subjected to ultrasonic cleaning for 5 minutes, and dried. As a result, it became impossible to visually observe the deposition of abrasive grains. However, as a result of SEM observation of the cross section and the sidewall of the slit-processed part, it was observed here and there that the abrasive grains dug and remained in the sidewalls of the through trenches of the porous drawn PTFE film. However, the porous structure of the trenchesidewall was held without being broken.

Example 3

A porous drawn PTFE film (trade name "WP500-100", manufactured by SUMITOMO ELECTRIC FINE POLYMER, INC.) with a pore size of 5 µm, a porosity of about 80%, and a film thickness of 100 µm was smoothed and placed on a glass plate, and fixed by a tape so as not to move. On the porous drawn PTFE film, an instant adhesive (trade name "Aron Alpha", manufactured by TOAGOSEI Co., Ltd.) was thinly applied. Then, on the adhesive layer, a mask made of a stainless steel with a thickness of 0.05 mm, having a slit with a width of 100 µm and a length of 5 mm opened therein, was placed. The film was allowed to stand still for a whole day and night, so that the instant adhesive was sufficiently dried, thereby to fix the mask made of a stainless steel on the porous drawn PTFE film.

From above the mask made of a stainless steel, a sand blast processing by a compressed air was carried out by the use of sodium chloride abrasive grains with an average grain diameter of about 5 µm. By the inspection with a transmitted light, it was verified that slit-like through trenches were formed in the porous drawn PTFE film. Then, the porous drawn PTFE film and the mask made of a stainless steel were removed from the glass plate.

This was dipped in acetone for several hours to dissolve the adhesive, and the mask made of a stainless steel and the porous drawn PTFE film were separated from each other. Then, the porous drawn PTFE film was dried. In the porous PTFE film, slit-like through trenches were formed. From the observation with an optical microscope in this state, it could be confirmed that abrasive grains were deposited on the periphery.

This was dipped in ethanol, and then, charged in water, and subjected to ultrasonic cleaning for 5 minutes, and dried. As a result of SEM observation of the cross section and the sidewall of the slit-processed part, it was not possible to confirm the presence of the abrasive grains. Further, the porous structure of the through trenchesidewall was held without being broken.

Example 4

On a glass plate, a polyurethane foam with a film thickness of 1 mm and a porosity of about 50% was laid, and fixed by an adhesive tape at the edges. On the polyurethane foam, a porous drawn PTFE film (trade name "HP010-60", manufactured by SUMITOMO ELECTRIC FINE POLYMER, INC.) with a pore size of 0.1 μm, a porosity of about 50%, and a film thickness of 60 μm was smoothed and placed, and fixed at the edges by a tape made of plastic so as not to move. On the porous drawn PTFE film, an instant adhesive (trade name "Aron Alpha", manufactured by TOAGOSEI Co., Ltd.) was thinly applied. Then, on the instant adhesive layer, a mask made of a stainless steel with a thickness of 0.05 mm, having a slit with a width of 100 μm and a length of 5 mm opened therein was placed. The film was allowed to stand still for a whole day and night, so that the instant adhesive was sufficiently dried, thereby to fix the mask made of a stainless steel on the porous drawn PTFE film.

From above the mask made of a stainless steel, a sand blast processing by a compressed air was carried out by the use of alumina abrasive grains with an average grain diameter of about 5 μm. By the inspection with a transmitted light, it was verified that slit-like through trenches were formed in the porous drawn PTFE film. Then, the porous drawn PTFE film and the mask made of a stainless steel were removed from the glass plate.

This was dipped in acetone for several hours to dissolve the adhesive, and the mask made of a stainless steel and the porous drawn PTFE film were separated from each other. Then, the porous PTFE film was dried. In the porous PTFE film, slit-like through trenches were formed. From the visual observation in this state, it could be confirmed that the periphery of the through trenches was colored, and that abrasive grains were deposited thereon.

This was dipped in ethanol, and subjected to ultrasonic cleaning for 5 minutes, and dried. As a result, it became impossible to visually observe the deposition of abrasive grains. As a result of SEM observation of the cross section and the sidewall of the slit-processed part, it was not possible to confirm the presence of abrasive grains. Further, the porous structure of the trenchesidewall was held without being broken. Further, it was possible to observe the state in which the roughness of the sidewall was lower than that of the through trenches formed in Example 1.

Example 5

1. Step of Fabricating a Multilayer Porous Drawn PTFE Sheet:

Twenty porous drawn PTFE films(trade name "HP010-60", manufactured by SUMITOMO ELECTRIC FINE POLYMER, INC.) with a pore size of 0.1 μm, a porosity of about 50%, and a film thickness of 60 μm were stacked one on another. The films were sandwiched between two stainless steel sheets of 200 mm square, and a thickness of 4 mm, and heated to 340° C. or more, and fused. Thus, a porous drawn PTFE sheet in a 20-layered structure with a film thickness of about 1200 μm was fabricated.

2. Step of Forming Trenches and Through Holes

On the opposite sides of the porous drawn PTFE sheet, an instant adhesive (trade name "Aron Alpha", manufactured by TOAGOSEI Co., Ltd.) was thinly applied. Then, on the respective adhesive layers, masks each made of a stainless steel with a thickness of 0.05 mm, having a slit with a width of 100 μm and a length of 5 mm opened therein, were placed, respectively. At this step, the two masks each made of a stainless steel were placed so that the respective slits intersected at right angles. The sheet was allowed to stand still for a whole day and night, so that the instant adhesive was sufficiently dried, thereby to fix the masks each made of a stainless steel on the porous drawn PTFE film.

This was placed on a glass plate. From above the masks each made of a stainless steel, a sand blast processing by a compressed air was carried out by the use of alumina abrasive grains with an average grain diameter of about 5 μm, on one side at one time for both sides. At the time when it can be confirmed that the depth of the trench is about half the film thickness, and that the portion of intersection of the slits on the opposite sides are penetrating therethrough, the sand blast processing was stopped.

This was dipped in acetone for several hours to dissolve the adhesive, and the masks each made of a stainless steel and the porous drawn PTFE film were separated from each other. Then, the porous drawn PTFE film was dried. It was confirmed that, in the porous drawn PTFE film, slit-like through trenches were formed on the opposite sides, and only each portion of intersection of the trenches on the opposite sides is penetrating therethrough. This was dipped in ethanol, and subjected to ultrasonic cleaning for 5 minutes.

3. Step of Imparting a Plating Catalyst:

Then, the porous drawn PTFE sheet was dipped in Melplate PC-321 manufactured by Meltex Inc., diluted to 100 ml/L at a temperature of 60° C. for 4 minutes, and conditioning was carried out. Further, the porous drawn PTFE sheet was dipped in 10% sulfuric acid 1 minute. Then, the sheet was dipped in a solution obtained by dissolving Enplate PC-236 manufactured by Meltex Inc., in 0.8% hydrochloric acid in a ratio of 180 g/L for 2 minutes. To an aqueous solution containing Enplate Activator 444 in an amount of 3%, and Enplate Activator Additive in an amount of 1%, manufactured by Meltex Inc., and hydrochloric acid in an amount of 3%, dissolved therein, Enplate PC-236 manufactured by Meltex Inc., was dissolved in a ratio of 150 g/L. In the resulting solution, the porous drawn PTFE sheet was dipped for 5 minutes, so that tin-palladium grains were deposited on the entire surface including the trenches and the through holes of the porous PTFE.

Then, in a solution obtained by diluting PA-360 manufactured by Meltex Inc., with distilled water to a ratio of 50 ml/L, the porous drawn PTFE sheet was dipped, thereby to activate the catalyst. Thereafter, from each of the opposite-side surface layers of the porous drawn PTFE sheet having a multilayer structure, respective one porous drawn PTFE film was peeled, resulting in a porous drawn PTFE sheet in which the plating catalyst had been deposited only on the trenches and through holes.

4. Step of Plating Processing:

In an electroless copper plating solution made up of Cu-3000A, Melplate Cu-3000B, Melplate Cu-3000C, and Melplate Cu-3000D, each in an amount of 5%, and Melplate Cu-3000 Stabilizer in an amount of 0.1%, manufactured by Meltex Inc., the porous drawn PTFE sheet was dipped with air stirring for 30 minutes, so that the sidewalls of the trenches and the through holes were subjected to copper plating.

Then, the porous drawn PTFE sheet was dipped in Activator Aurotech SIT Additive (80 ml/L) manufactured by Atotech for 3 minutes. Then, the sheet was dipped in a make-up solution of Aurotech SIT Activator, conc., (125 mg/L) manufactured by Atotech, and Activator Aurotech SIT Additive (80 mg/L) manufactured by Atotech for 1 minute. Thus, a palladium catalyst was fixed on the copper plating formed as described above.

Further, in an electroless nickel plating solution made up of sodium hypophosphite (20 g/L), trisodium citrate (40 g/L), ammonium borate (13 g/L), nickel sulfate (22 g/L), the porous drawn PTFE sheet was dipped for 5 minutes, so that the surface of the copper plated layer was coated with nickel plating.

Then, the porous drawn PTFE sheet was dipped in a displacement gold plating solution manufactured by Meltex Inc., Melplate AU-6630A (200 ml/L), Melplate AU-6630B (100 ml/L), Melplate AU-6630C (20 g/L), and sodium gold sulfite aqueous solution (gold 1.0 g/L) at 60° C. for 5 minutes. Thus, coating by gold plating was further carried out.

Through the respective steps up to this point, it was possible to manufacture an electric circuit substrate made of the porous drawn PTFE sheet in which only the trenches and through holes had been made conductive. The resulting electric circuit was the one capable of withstanding the peeling test by an adhesive tape. Further, the electric circuit substrate was very soft, and hence the electric circuit was not peeled even when applied with bending, compression, or twist deformation.

Comparative Example 1

A nonporous PTFE film with a film thickness of 100 µm (trade name "NAFLON TAPE", manufactured by NICHIAS Corporation was smoothed and placed on a glass plate, and fixed at the edges by a tape made of plastic so as not to move. On the nonporous PTFE film, an instant adhesive (trade name "Aron Alpha", manufactured by TOAGOSEI Co., Ltd.) was thinly applied. Then, a mask made of a stainless steel with a thickness of 0.05 mm, having a slit with a width of 100 µm and a length of 5 mm opened therein, was placed. The film was allowed to stand still for a whole day and night, so that the instant adhesive was sufficiently dried. As a result, the mask made of a stainless steel was fixed on the nonporous PTFE film, and further fixed at the edges by an adhesive tape.

From above the mask made of a stainless steel, a sand blast processing by a compressed air was carried out by the use of alumina abrasive grains with an average grain diameter of about 5 µm. As a result, prior to the formation of through trenches in the nonporous PTFE film, the edges of the slits of the mask made of a stainless steel were destroyed to be roughened, and the edges curled up and floated, resulting in difficult conditions for processing. Thus, the sandblast processing was stopped in progress.

This was dipped in acetone for several hours to dissolve the adhesive, and the mask made of a stainless steel and the porous PTFE film were separated from each other. Then, the porous PTFE film was dried. This was dipped in ethanol, and subjected to ultrasonic cleaning for 5 minutes, and then dried. As a result of SEM observation of the cross section and the sidewall of the sand blast-processed part, the depth of each trench was as shallow as 20 µm or less. Further, the edge portion of each trench was also blunted.

The invention was described in details, and by reference to specific embodiments. However, it is obvious to those skilled in the art that various changes and modifications may be made without departing from the spirit and the scope of the invention.

This application is based on Japanese Patent Application No. 2004-007043 filed on Jan. 14, 2004, the contents of which are hereby incorporated by reference.

INDUSTRIAL APPLICABILITY

The method of the present invention is suitable as a method for patterning through portions such through holes and through trenches, and recessed portions such as trenches in a porous molded product or a nonwoven fabric. The porous molded product or the nonwoven fabric having a plated layer formed in a pattern therein of the invention can be preferably applied to the technical fields of a semiconductor device-mounting member, a member for electric reliability inspection, and the like, as an electric circuit component.

The invention claimed is:

1. An electric circuit component comprising a patterned porous molded product or nonwoven fabric having a plated layer in a pattern, characterized in that in a film-like or sheet-like porous molded product or nonwoven fabric formed from an organic polymer material, through portions or recessed portions in a pattern, or both of these are formed, and that the plated layer is selectively formed only on surfaces of the through portions or the recessed portions, or both of these.

2. The electric circuit component according to claim 1, wherein the porous molded product is a monolayer or multilayer film or sheet made of a porous fluororesin.

3. A method for manufacturing a patterned porous molded product or nonwoven fabric, characterized by placing a first mask having through holes in a pattern on a first side of a film-like or sheet-like porous molded product or nonwoven fabric formed from an organic polymer material, spraying a fluid or a fluid containing abrasive grains from above the first mask, and forming first through holes or first recessed portions, or both of these, to which opening shapes of the through holes of the first mask have been transferred, in the porous molded product or the nonwoven fabric, wherein after the formation of the first recessed portions on the first side of the porous molded product or the nonwoven fabric, second recessed portions are formed on a second side of the porous molded product or the nonwoven fabric opposite to the first side by using a second mask.

4. The manufacturing method according to claim 3, characterized in that after the formation of the first recessed portions on the first side of the porous molded product or the nonwoven fabric, the second recessed portions are formed on the second side of the porous molded product or the nonwoven fabric, to form the through holes by connecting the first recessed portions and the second recessed portions.

5. The manufacturing method according to any one of claims 1 and 4, wherein the fluid is a gas or a liquid.

6. The manufacturing method according to any one of claims 1 and 4, wherein the abrasive grains are grains having an average grain size equal to, or larger than an average pore size of the porous molded product.

7. The manufacturing method according to any one of claims 1 and 4, wherein the abrasive grains are grains made of a material capable of being extracted and removed with a solvent.

8. The manufacturing method according to claim 7, wherein the abrasive grains are grains of a water-soluble inorganic salt.

9. The manufacturing method according to claim 1, wherein:

the first mask is placed on the first side of the porous molded product or the nonwoven fabric, a buffer material having flexibility is placed on the second side, a fluid or a fluid containing abrasive grains is sprayed from above the first mask, thereby to form the first through portions or the first recessed portions, or both of these, to which the opening shapes of the through holes of the first mask have been transferred, in the porous molded product or the nonwoven fabric, after forming the first through portions or the first recessed portions, the buffer material is removed from the second side, and after removing the buffer material, the second recessed portions are formed on the second side by using the second mask.

10. The manufacturing method according to any one of claims 1 and 4, wherein the porous molded product is a monolayer or multilayer film or sheet made of a porous fluororesin.

11. A method for manufacturing a patterned porous molded product or nonwoven fabric having a plated layer in a pattern, having the following steps 1 to 4;

(1) a step 1 of placing a mask having through holes in a pattern on at least one side of a film-like or sheet-like porous molded product or nonwoven fabric formed from an organic polymer material via a resin layer for resist, spraying a fluid or a fluid containing abrasive grains from above the mask, and forming through holes or recessed portions, or both of these, to which opening shapes of the through holes of the mask have been transferred, in the resin layer for resist, and the porous molded product or the nonwoven fabric, (2) a step 2 of imparting a plating catalyst onto the entire surface of the porous molded product or the nonwoven fabric including the resin layer for resist, in which through holes or recessed portions, or both of these have been formed, (3) a step 3 of peeling the resin layer for resist, and (4) a step 4 of performing a selective plating to one side or both sides of the porous molded product or those of the nonwoven fabric by selectively forming a plated layer over the through portions or the recessed portions where the plating catalyst has been deposited.

12. The manufacturing method according to claim 11, wherein the porous molded product is a monolayer or multilayer film or sheet made of a porous fluororesin.

* * * * *